(12) United States Patent
Miyaji et al.

(10) Patent No.: US 12,237,728 B2
(45) Date of Patent: Feb. 25, 2025

(54) MOTOR AND ROTARY APPARATUS INCLUDING THE SAME

(71) Applicant: MINEBEA MITSUMI Inc., Nagano (JP)

(72) Inventors: Haruka Miyaji, Toyohashi (JP); Kazuo Takada, Kosai (JP); Shigeki Miyaji, Hamamatsu (JP); Takayuki Matsui, Toyohashi (JP)

(73) Assignee: MINEBEA MITSUMI Inc., Nagano (JP)

( * ) Notice: Subject to any disclaimer, the term of this patent is extended or adjusted under 35 U.S.C. 154(b) by 208 days.

(21) Appl. No.: 17/804,637

(22) Filed: May 31, 2022

(65) Prior Publication Data

US 2022/0294313 A1    Sep. 15, 2022

Related U.S. Application Data

(60) Division of application No. 16/282,724, filed on Feb. 22, 2019, now Pat. No. 11,381,139, and a
(Continued)

(30) Foreign Application Priority Data

Aug. 30, 2016  (JP) .................................. 2016-167939
May 19, 2017  (JP) .................................. 2017-099780

(51) Int. Cl.
*H02K 11/01* (2016.01)
*H02K 5/22* (2006.01)
(Continued)

(52) U.S. Cl.
CPC ......... *H02K 11/0141* (2020.08); *H02K 5/225* (2013.01); *H02K 7/1166* (2013.01);
(Continued)

(58) Field of Classification Search
CPC .. H02K 11/0141; H02K 5/225; H02K 7/1166; H02K 11/40; H02K 2211/03;
(Continued)

(56) References Cited

U.S. PATENT DOCUMENTS

2005/0023904 A1    2/2005  Cara et al.
2011/0316374 A1   12/2011  Miyaji et al.
(Continued)

FOREIGN PATENT DOCUMENTS

JP    2003-346470 A    12/2003
JP    2004-356099 A    12/2004
(Continued)

OTHER PUBLICATIONS

International Search Report for corresponding International Application No. PCT/JP2017/029882 mailed Nov. 21, 2017.
(Continued)

*Primary Examiner* — Christopher M Koehler
*Assistant Examiner* — Riley Owen Stout
(74) *Attorney, Agent, or Firm* — Chrisman Gallo Tochtrop LLC (57) ABSTRACT

To provide a motor inhibiting emission of electromagnetic noise (EMC) to the outside and a rotary apparatus including the motor. The rotary apparatus of the present disclosure includes: a housing; a motor arranged inside the housing; a circuit board arranged inside the housing and electrically connected to the motor; and a flexible wiring board electrically connecting the motor to the circuit board, the motor including a frame formed with a conductive member, the frame electrically connected via the flexible wiring board to a ground of the circuit board.

5 Claims, 9 Drawing Sheets

Related U.S. Application Data continuation of application No. PCT/JP2017/029882, filed on Aug. 22, 2017.

(51) Int. Cl.
*H02K 7/116* (2006.01)
*H02K 11/40* (2016.01)
*H05K 1/18* (2006.01)

(52) U.S. Cl.
CPC .......... *H02K 11/40* (2016.01); *H02K 2211/03* (2013.01); *H05K 1/189* (2013.01)

(58) Field of Classification Search
CPC ................. H05K 1/189; H05K 3/3447; H05K 2201/056; H05K 2201/058
See application file for complete search history.

(56) References Cited

U.S. PATENT DOCUMENTS

| | | | | |
|---|---|---|---|---|
| 2013/0193814 | A1* | 8/2013 | Miyaji | H02K 13/00 310/68 R |
| 2017/0361681 | A1* | 12/2017 | Matsumura | B60H 1/00842 |

FOREIGN PATENT DOCUMENTS

| | | |
|---|---|---|
| JP | 2005-176420 A | 6/2005 |
| JP | 2007-181343 A | 7/2007 |
| JP | 2011-168180 A | 9/2011 |
| JP | 2013-158172 A | 8/2013 |
| JP | 2014-017929 A | 1/2014 |

OTHER PUBLICATIONS

Written Opinion for corresponding International Application No. PCT/JP2017/029882 dated Nov. 21, 2017.
English translation of Written Opinion for corresponding International Application No. PCT/JP2017/029882 dated Nov. 21, 2017.
International Preliminary Report on Patentability for corresponding International Application No. PCT/JP2017/029882 dated Mar. 5, 2019.
Japanese Office Action dated May 8, 2019 for corresponding Japanese Application No. 2017-099780 and English translation.
Japanese Office Action dated Jun. 18, 2020 for corresponding Japanese Application No. 2019-146629 and English translation.

* cited by examiner

FIG.10

MOTOR AND ROTARY APPARATUS INCLUDING THE SAME

CROSS REFERENCE TO RELATED APPLICATIONS

The present application is a divisional application of U.S. application Ser. No. 16/282,724 filed on Feb. 22, 2019, which is a continuation application of International Patent Application No. PCT/JP2017/029882 filed on Aug. 22, 2017, which claims the benefit of Japanese Patent Application No. 2016-167939, filed on Aug. 30, 2016 and Japanese Patent Application No. 2017-099780, filed on May 19, 2017. The contents of these applications are incorporated herein by reference in their entirety.

BACKGROUND

Technical Field

The present disclosure relates to a motor and a rotary apparatus including the motor.

Background

For example, in Japanese Patent Laid-Open No. 2013-158172, a motor having a holder allowing a flexible printed circuit board to be mounted accurately and reliably, preventing wire disconnection and rupture of the flexible printed circuit board even after mounting the flexible printed circuit board and thus enabling stable quality to be maintained, and allowing detachment together with the flexible printed circuit board when some hindrance is caused and an actuator (hereinafter, referred to as a rotary apparatus) using the motor are disclosed.

For example, a rotary apparatus is used in an air-conditioning system of an automobile and the like, and on the periphery of the rotary apparatus, other electronic components and the like are also arranged.

Upon driving the rotary apparatus, electromagnetic noise is generated from a motor serving as a driving source of the rotary apparatus, and the other electronic components arranged on the periphery of the rotary apparatus may be adversely affected.

The present disclosure is related to providing a motor inhibiting emission of electromagnetic noise to the outside and a rotary apparatus including the motor.

SUMMARY

In accordance with one aspect of the present disclosure, (1) a rotary apparatus includes: a housing; a motor arranged inside the housing; a circuit board arranged inside the housing and electrically connected to the motor; and a flexible wiring board electrically connecting the motor to the circuit board, the motor includes a frame formed with a conductive member, and the frame is electrically connected via the flexible wiring board to a ground of the circuit board.

(2) In the above-described configuration (1), the motor includes: a holder provided at the frame; and a plate-like spring supported to the holder, the spring electrically connects the frame and the flexible wiring board, bent one part of the spring contacts the frame, and the spring is elastically deformable in such a direction as to be away from the frame.

(3) In the above-described configuration (2), the flexible wiring board is placed at the holder, other part of the spring is supported to a surface of the holder, the surface facing the frame, the motor includes a terminal led out from the frame outwardly, and the terminal passes through the holder and is electrically connected to the flexible wiring board.

(4) In the above-described configuration (3), the frame has an opening part leading out the terminal, the flexible wiring board has a first connection part electrically connected to the terminal, the holder includes a placement part, the first connection part placed at the placement part, the placement part is arranged on the opening part, and the spring formed with a conductive member is electrically connected to the first connection part.

(5) In the above-described configuration (4), the holder includes a supporting part extending from the placement part to an outside of the opening part, and the placement part is supported by the supporting part to the frame.

(6) In the above-described configuration (4) or (5), the terminal passes through a hole part of the placement part, a first end portion of the terminal is led out to a side of the placement part, the side being opposite to a side of the frame, and the first end portion is electrically connected to the first connection part.

(7) In any one of the above-described configurations (4) to (6), the motor includes a guide part provided inside the opening part, and the guide part engages with the holder.

(8) In the above-described configuration (1), the rotary apparatus includes a flat plate-like member electrically attached to a side surface of the frame, and the frame is electrically connected via the flat plate-like member and the flexible wiring board to a ground of the circuit board.

(9) In any one of the above-described configurations (1) to (8), the rotary apparatus includes a gear transmitting rotation of the motor arranged inside the housing to the outside.

In accordance with another aspect of the present disclosure, (10) a motor includes: a frame formed with a conductive member; a terminal led out from the frame outwardly; a holder having a placement part, a flexible wiring board placed at the placement part; and a plate-like spring formed with a conductive member, the flexible wiring board is electrically connected to the terminal, bent one part of the spring contacts the frame, other part of the spring is supported to the holder, and the frame is electrically connectable via the spring and the flexible wiring board to a ground.

According to the present disclosure, the motor inhibiting emission of electromagnetic noise to the outside and the rotary apparatus including the motor can be provided.

DETAILED DESCRIPTION

Hereinafter, modes for carrying out the present disclosure (hereinafter, referred to as "embodiments") will be described in detail with reference to the accompanying drawings.

The same components are denoted with the same reference numerals throughout the description of the embodiments.

First Embodiment

Figure 1:
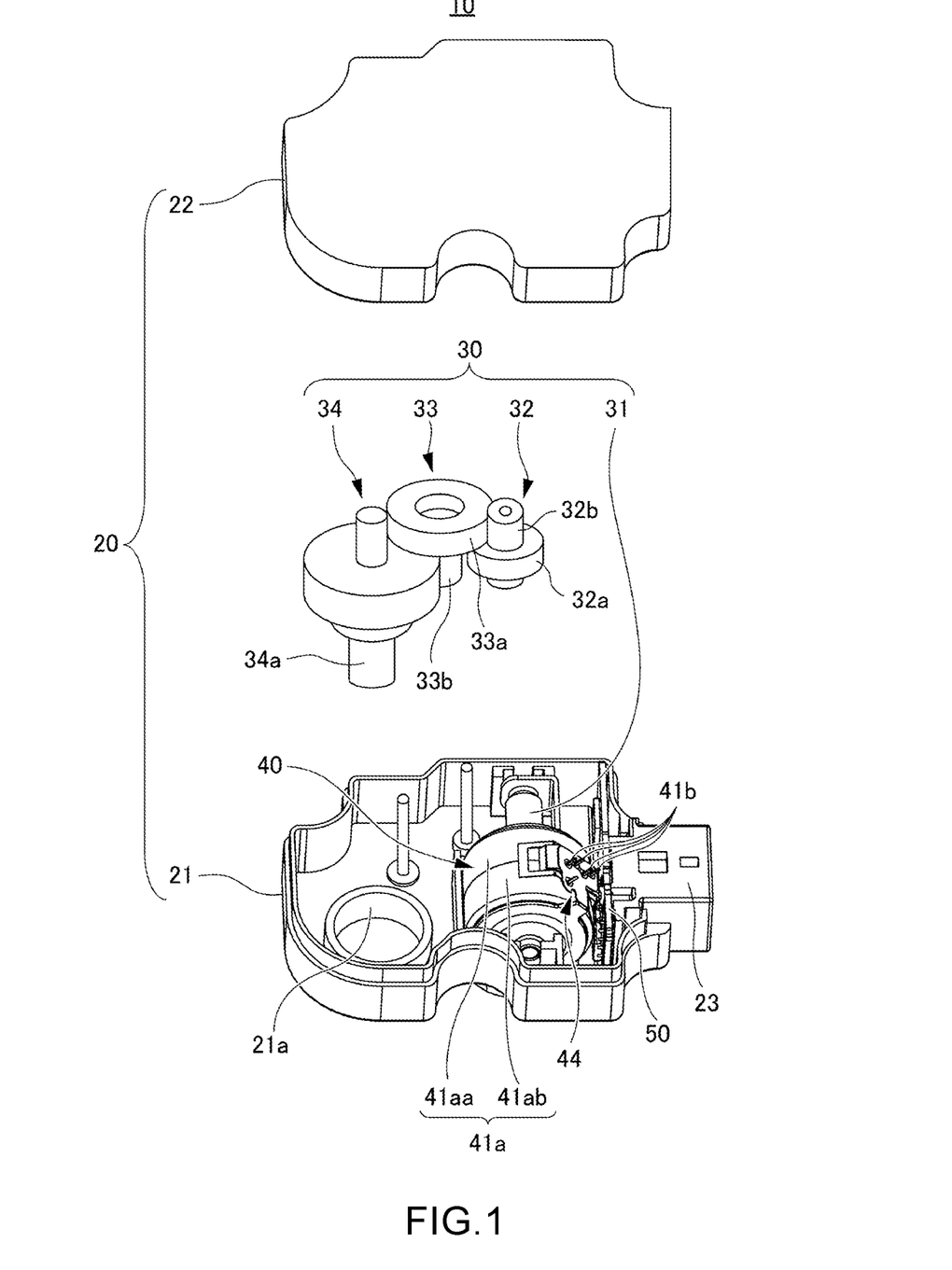
FIG. 1 is a partially exploded perspective view of a rotary apparatus in a first embodiment according to the present disclosure.

FIG. 1 is a partially exploded perspective view of a rotary apparatus 10 in a first embodiment according to the present disclosure.

As shown in FIG. 1, the rotary apparatus 10 includes a housing 20 and various components (a plurality of gears 30, a motor 40, a flexible wiring board 44, a circuit board 50, and the like) arranged inside the housing 20.

(Housing)

The housing 20 includes a first housing 21 with the various components (the plurality of gears 30, the motor 40, the circuit board 50, and the like) arranged and a second housing 22 united with the first housing 21 so as to cover an opening side (an upper side in FIG. 1) of the first housing 21 and serving as a lid part.

These first housing 21 and second housing 22 are formed with, for example, a resin material such as polypropylene, polyethylene-terephthalate, polybutylene terephthalate, and ABS.

(Gears)

The plurality of gears 30 are gears for mechanically transmitting rotation of the motor 40 at a predetermined gear ratio to the outside.

Specifically, as shown in FIG. 1, the plurality of gears 30 include a worm gear 31 fixed to a shaft of the motor 40, a first gear 32 connected to the worm gear 31, a second gear 33 connected to the first gear 32, and an output gear 34 connected to the second gear 33.

Since the first gear 32 is connected to the worm gear 31 and the second gear 33, the first gear 32 is constituted of a two-step gear. Of the two-step gear, a gear 32a having a large diameter is connected to the worm gear 31 and a gear 32b having a small diameter is connected to the second gear 33.

Similarly, since the second gear 33 is connected to the first gear 32 and the output gear 34, the second gear 33 is constituted of a two-step gear. Of the two-step gear, a gear 33a having a large diameter is connected to the first gear 32 (the gear 32b having the small diameter) and a gear 33b having a small diameter is connected to the output gear 34.

In the first housing 21, an opening part 21a communicating with the outside is formed in a position corresponding to the output gear 34.

This allows access to the output gear 34 from the outside of the housing 20 via the opening part 21a.

Accordingly, a shaft of a louver or the like used in an air-conditioning system of an automobile or the like can be fitted to the fitting part 34a provided for the output gear 34 via the opening part 21a.

(Flexible Wiring Board)

A flexible wiring board 44 electrically connects a motor 40 and a circuit board 50.

The details as to the flexible wiring board 44 have relevance to attachment and the like to the motor 40 and therefore, will be described in the description of the motor 40.

(Circuit Board)

On a circuit board 50, wiring for electrically connecting at least the later-described flexible wiring board 44 and the outside is formed.

In an example shown in FIG. 1, the circuit board 50 is provided with circuitry for controlling rotation and the like of the motor 40, and the circuitry is located in the vicinity of a connector connection part 23 of the first housing 21.

The circuit board 50 is provided with external connection terminals (not shown) arranged so as to extend from the circuit board 50 into the connector connection part 23.

In addition, the circuit board 50 is also provided with internal connection terminals (not shown) located on a side of the motor 40 and electrically connected to the motor 40.

(Motor)

Figure 2:
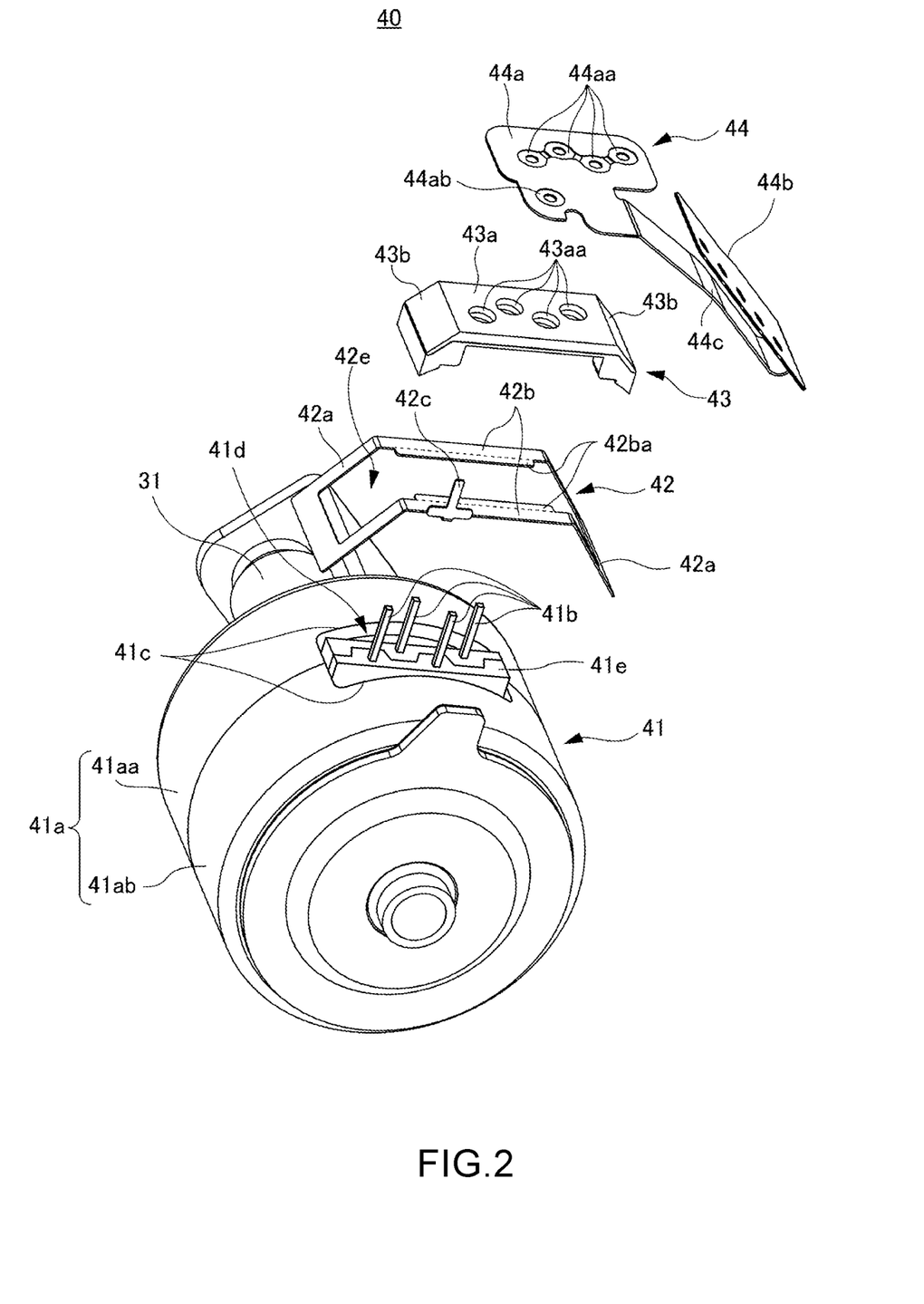
FIG. 2 is a partially exploded perspective view of a motor in the first embodiment according to the present disclosure.

FIG. 2 is a partially exploded perspective view of a motor 40.

In FIG. 2, a state with a worm gear 31 attached to the shaft of the motor 40 is shown.

The motor 40 includes a motor body 41, a spring 42, and a holder 43, and a flexible wiring board 44 is electrically connected to the motor 40.

(Motor Body)

A motor body 41 has a frame 41a serving as an outer frame and formed with a conductive member, and a rotor and a stator housed inside the frame 41a.

The rotor and the stator may have configurations similar to a rotor and a stator of the heretofore known motor.

The rotor includes, for example, a shaft serving as a shaft having one part led out from the motor body 41 and a rotor magnet attached to the outer periphery of the shaft.

In addition, the stator includes a stator core (also referred to as a yoke) provided so as to form a space for arranging a rotor magnet in a central portion of the stator core and having a plurality of teeth, an insulator (also referred to as a bobbin) covering the stator core, and a plurality of coils wound onto the teeth via the insulator.

The rotor is rotatably supported by bearings arranged on one end side and another end side of the frame 41a so as to locate the rotor magnet in the space provided in the central portion of the stator core.

In addition, positions for locating the bearings can be appropriately changed.

For example, the one bearing may be located on the one end side of the frame 41a and the other bearing may be located outside or inside the frame 41a.

Further, the plurality of coils are respectively connected to terminals 41b, and current is supplied from the terminals 41b.

When the current is supplied from these terminals 41b to the coils, in accordance with winding directions of the coils around the teeth of the stator core and directions of the current applied to the coils, the teeth are excited to an N pole or an S pole, mutual attraction with the rotor magnet occurs, and the rotor rotates.

The directions of the current applied to the coils or the coils with the current supplied are switched, an exciting state of the teeth is controlled, and thus, the rotation of the rotor continues.

In the present embodiment, as shown in FIG. 2, the frame 41a includes a first frame 41aa constituting a substantially half of the frame 41a and a second frame 41ab constituting the remaining substantially half of the frame 41a.

The first frame 41aa is located on the one end side of the frame 41a.

The second frame 41ab is located on the other end side of the frame 41a.

In end portions of the first frame 41aa and the second frame 41ab, recessed portions 41c are respectively formed.

These recessed portions 41c face each other in a direction of the shaft.

In addition, between these recessed portions 41c, the terminals 41b are located.

Accordingly, when the first frame 41aa and the second frame 41ab are united to be in a state of the frame 41a, the frame 41a comes to have an opening part 41d for leading out the terminals 41b to the outside.

In other words, the opening part 41d is formed by the recessed portions 41c of the first frame 41aa and the second frame 41ab, and the terminals 41b are led out from the frame 41a outwardly.

(Spring)

In the present embodiment, the spring 42 is a plate-like spring formed with a conductive member.

As shown in FIG. 2, the spring 42 includes two end portions (one part) and central portions 42b (other part).

This spring 42 has a substantially rectangular opening 42e (laterally long and rectangular opening) in a central portion of the spring 42 and is formed with a plate member (conductive member) having a laterally long and rectangular outer shape.

In addition, both end portions of the spring 42 are elastic parts 42a formed by bending the plate member.

These elastic parts 42a are formed by bending the end portions of the spring 42 with respect to the central portions 42b and are bent portions.

The spring 42 is a laterally long and substantially rectangular frame body.

By bending the two end portions of this frame body with respect to the central portions 42b toward a side of the frame 41a, a pair of the elastic parts 42a generates a biasing force in such a direction as to be away from the frame 41a.

On the central portions 42b of the spring 42, projecting parts 42ba projecting toward an inside of the opening are formed.

Figure 3:
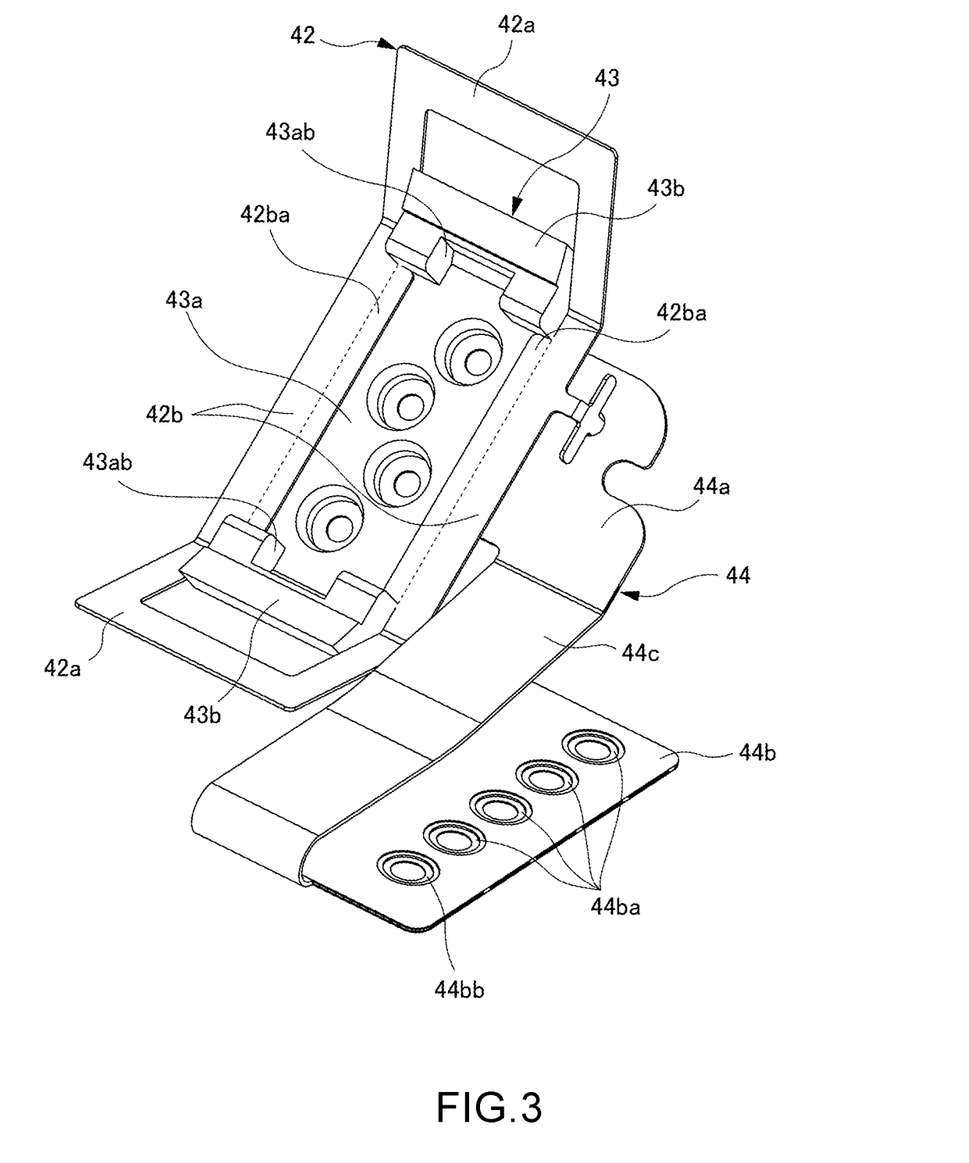
FIG. 3 is a perspective view showing a state with a spring, a holder, and a flexible wiring board assembled in the first embodiment according to the present disclosure.

FIG. 3 is a perspective view showing a state with the spring 42, the holder 43, and the flexible wiring board 44 assembled.

FIG. 3 is the perspective view, viewed from a side of the frame 41a when the spring 42, the holder 43, and the flexible wiring board 44 are attached to the frame 41a.

As shown in FIG. 3, the spring 42 is supported to the holder 43, and the spring 42 is supported to a surface of the holder 43, the surface facing the frame 41a.

In detail, the central portions 42b (the other part) of the spring 42 are supported to the surface of the holder 43, the surface facing the frame 41a.

In addition, the two end portions (the one part) of the spring 42 contact the frame 41a.

The pair of the projecting parts 42ba formed at the central portions 42b of this spring 42 constitutes flange parts contacting the holder 43.

In addition, as shown in FIG. 2, the spring 42 has, at one part of the outer periphery of the central portions 42b, a connection pin 42c formed so as to be bent toward a side of the holder 43.

This connection pin 42c plays a role as a terminal electrically connected to the later-described flexible wiring board 44 by a conductive member such as solder.

In other words, the spring 42 electrically connects the frame 41a and the flexible wiring board 44.

(Holder)

The holder 43 is provided at the frame 41a.

As shown in FIG. 2, this holder 43 has a placement part 43a arranged on an opening part 41d of a frame 41a and a pair of supporting parts 43b supporting the placement part 43a to the frame 41a.

The placement part 43a is supported by the supporting parts 43b to the frame 41a.

This pair of supporting parts 43b extends from the placement part 43a toward an outside of the opening part 41d and extends along an outer peripheral surface of the frame 41a.

The holder 43 is formed with, for example, an insulating material such as an insulating resin.

Figure 4:
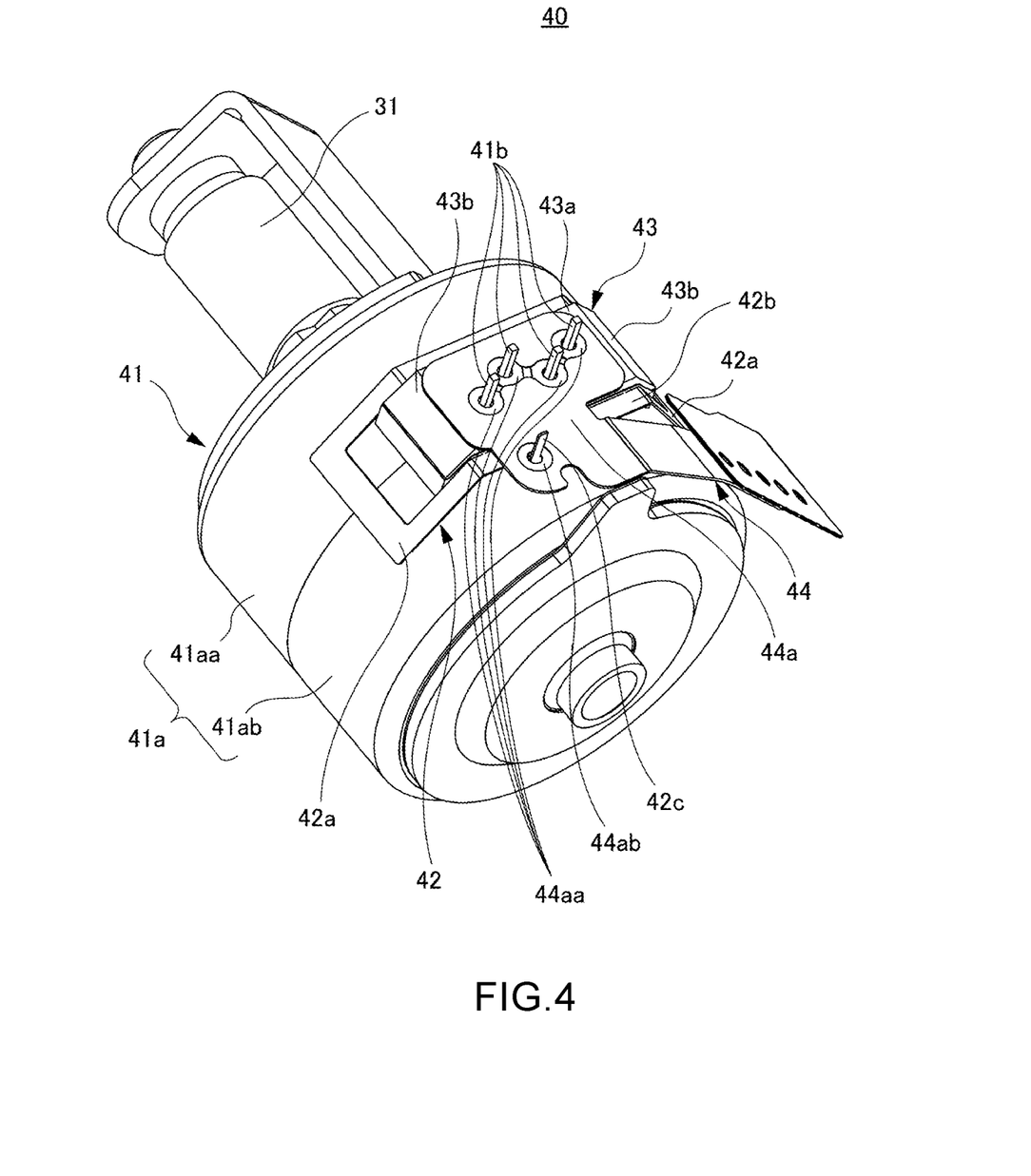
FIG. 4 is a perspective view of the motor in the first embodiment according to the present disclosure.

FIG. 4 is a perspective view of the motor 40.

In FIG. 4, a state with the worm gear 31 attached to the shaft of the motor 40 is shown.

In addition, FIG. 4 also shows the flexible wiring board 44.

As shown in FIG. 4, the placement part 43a of the holder 43 is a part with one part of the flexible wiring board 44 placed.

In detail, the placement part 43a is a part with a first connection part 44a placed, the first connection part 44a electrically connected to the terminals 41b of the motor body 41 of the flexible wiring board 44.

Thus, the flexible wiring board 44 is placed at the holder 43.

Therefore, the placement part 43a has hole parts 43aa for leading out the terminals 41b connected to the first connection part 44a. The terminals 41b pass through the hole parts 43aa, and one end portion (first end portion) of each of the terminals 41b is led out from a surface of a side of the placement part 43a opposite to a surface of a side of the frame 41a with the first connection part 44a arranged.

Thus, the terminals 41b pass through the holder 43 and are electrically connected to the flexible wiring board 44.

In the present embodiment, since the motor body 41 has the four terminals 41b, the four hole parts 43aa are formed in the placement part 43a in positions corresponding to the four terminals 41b.

In addition, as shown in FIG. 3, the placement part 43a plays a role also as a reception part receiving the pair of projecting parts 42ba formed at the central portions 42b of the spring 42 by a surface of the placement part 43a on the side of the frame 41a.

On the other hand, as shown in FIG. 3, the holder 43 is provided with U-shaped recessed parts 43ab opened toward a central side of the placement part 43a in portions connecting the placement part 43a and the supporting parts 43b.

These recessed parts 43ab are formed in a surface of the holder 43 on the side of the frame 41a.

As shown in FIG. 2, inside the opening part 41d of the frame 41a, a guide part 41e arranged so as to surround the terminals 41b is provided. The above-mentioned recessed parts 43ab are formed each in a size allowing engagement with this guide part 41e.

This guide part 41e serves as a contact part contacting the recessed parts 43ab or a positioning part for the recessed parts 43ab.

The guide part 41e is formed with a member of an insulator, and the terminals 41b are press-fitted into the insulator and fixed.

This guide part 41e serves as a contact part contacting the recessed parts 43ab or a positioning part for the recessed parts 43ab.

Therefore, as shown in FIG. 4, when the holder 43 is placed on the frame 41a, this guide part 41e engages with the recessed parts 43ab of the holder 43 and inhibits movement of the holder 43 in such a direction as to be away from the frame 41a and in a direction orthogonal to the frame 41a.

It is not necessary for this guide part 41e to be a part press-fitted into the recessed parts 43ab, and it is only required for the guide part 41e to be capable of inhibiting large movement of the holder 43.

(Flexible Wiring Board)

The flexible wiring board 44 is a member for electrically connecting the terminals 41b of the motor body 41 and the above-mentioned internal connection terminals (not shown) provided at the circuit board 50 to one another.

Therefore, as shown in FIG. 2, the flexible wiring board 44 includes the first connection part 44a electrically connected to the terminals 41b, a second connection part 44b connected to the internal connection terminals (not shown) of the circuit board 50, and a wiring part 44c connecting the first connection part 44a and the second connection part 44b to each other.

As shown in FIG. 2, the first connection part 44a is provided with four hole parts in positions corresponding to the four terminals 41b of the motor body 41.

On the respective peripheries of the four hole parts, lands 44aa for electrically connecting to the terminals 41b are provided by using a conductive member such as solder.

On the other hand, as shown in FIG. 3, the second connection part 44b is provided with four hole parts, the four internal connection terminals (not shown) of the circuit board 50 inserted into the four hole parts, the four internal connection terminals (not shown) of the circuit board 50 electrically connected to the four terminals 41b of the motor body 41.

On the respective peripheries of the four hole parts of the second connection part 44b, lands 44ba for electrically connecting to the internal connection terminals (not shown) are provided by using solder or the like.

In addition, the respective lands 44aa and the respective lands 44ba are electrically connected to one another by conductive patterns (not shown) formed at the wiring part 44c or the like.

As shown in FIG. 2, the first connection part 44a of the flexible wiring board 44 is also provided with a hole part in a position corresponding to the connection pin 42c of the spring 42, the connection pin 42c inserted into the hole part. Also on the periphery of the hole part, a land 44ab for electrically connecting to the connection pin 42c is provided by using the conductive member such as the solder.

As shown in FIG. 3, the second connection part 44b of the flexible wiring board 44 is provided with a hole part, a ground terminal (not shown) of the circuit board 50 inserted into the hole part. On the periphery of the hole part, a land 44bb electrically connected to the land 44ab (see FIG. 2) is provided by using a conductive pattern (not shown) formed at the wiring part 44c or the like.

The conductive patterns connecting the lands 44aa and the lands 44ba to one another and formed at the wiring part 44c are not electrically connected to the conductive pattern connecting the land 44ab and the land 44bb to each other and formed at the wiring part 44c.

Accordingly, the spring 42 is capable of electrically connecting to a ground of the circuit board 50 via the flexible wiring board 44.

When the spring 42 is electrically connected to the ground of the circuit board 50, the spring 42 is brought to have the same potential as a potential of the ground of the circuit board 50.

In addition, by connecting an external apparatus to external connection terminals, the ground of the circuit board 50 is brought to have the same potential as a potential of a ground of the external apparatus.

Next, procedures and the like for attaching the spring 42, the holder 43, and the flexible wiring board 44 onto the motor body 41 will be described and further detailed description will be set forth.

As shown in FIG. 4, the spring 42, the holder 43, and the first connection part 44a of the flexible wiring board 44 are arranged so as to be positioned in the order of the spring 42, the holder 43, and the first connection part 44a from the side of the frame 41a of the motor body 41.

At this time, the terminals 41b of the motor body 41 are arranged so as to be led out from the hole parts 43aa (see FIG. 2) formed in the placement part 43a of the holder 43 and the hole parts (with the lands 44aa formed) of the first connection part 44a.

At this time, the connection pin 42c of the spring 42 is also brought to be led out from the corresponding hole part (with the land 44ab formed) of the first connection part 44a.

Here, as shown in FIG. 4, when only the spring 42, holder 43, and first connection part 44a are arranged, the holder 43 and the first connection part 44a are biased in such a direction as to be away from the frame 41a by a biasing force of the elastic parts 42a of the spring 42 contacting the frame 41a.

Therefore, by fixing the holder 43 and the first connection part 44a to the frame 41a and biasing the spring 42 to a side of the frame 41a, the supporting parts 43b of the holder 43 are brought to contact the frame 41a via the opening 42e inside the spring 42.

At this time, the elastic parts 42a of the spring 42 are elastically deformed, and the spring 42 is brought to firmly contact the frame 41a.

With the supporting parts 43b of the holder 43 contacting the frame 41a, a first fixing part (not shown) for fixing, by using the conductive member such as the solder, to each of the lands 44aa of the first connection part 44a, a first end portion of each of the terminals 41b in the placement part 43a and the first connection part 44a led out to a side opposite to the frame 41a (a portion of each of the terminals 41b extending out from each of the hole parts shown in FIG. 4) through each of the hole parts (with lands 44aa formed) is formed.

At this time, the connection pin 42c of the spring 42 is also fixed to the land 44ab of the first connection part 44a by using the conductive member such as the solder.

The first fixing part formed as described above not only electrically connects the first connection part 44a of the flexible wiring board 44 and each of the terminals 41b but also plays a role of inhibiting the movement of the holder 43 in such a direction as to be away from the frame 41a by the biasing force of the spring 42.

Thus, since the holder 43 does not move in such a direction as to be away from the frame 41a, the elastic parts 42a of the spring 42 are kept in the elastically deformed state, and the spring 42 continues to contact the frame 41a.

As described above, since both of the spring 42 and the frame 41a are formed with the conductive member, when the spring 42 contacts the frame 41a, the frame 41a and the spring 42 are short-circuited.

Accordingly, since the frame 41a is also brought to be electrically connected to the ground of the circuit board 50 via the flexible wiring board 44, the frame 41a comes to have the same potential as the potential of the ground of the circuit board 50 and to play a role as an electromagnetic shield.

Therefore, emission of electromagnetic noise generated inside the motor body 41 to the outside of the motor 40 is inhibited.

On the other hand, since the first connection part 44a of the flexible wiring board 44 is inhibited from moving to the side of the frame 41a by the holder 43, stress exerted on the first fixing part is inhibited, and a crack and the like caused in the first fixing part can be inhibited.

Because the biasing force of the spring 42 is exerted on the first fixing part, due to this influence, breakage of the first fixing part may be caused.

Accordingly, it is better for the biasing force of the spring 42 to be too strong. When the holder 43 is brought to be fixed by the first fixing part so as not to move in such a direction as to be away from the frame 41a, it is preferable that a spring force exhibited by one of the elastic parts 42a is less than or equal to 80 gf and it is more preferable that the spring force exhibited by one of the elastic parts 42a is less than or equal to 70 gf.

The spring force referred to herein is a force exhibited by one of the elastic parts 42a when the supporting parts 43b of the holder 43 are brought to contact the frame 41a.

By employing the above-described configuration, the frame 41a can be easily connected to the ground of the circuit board 50 by utilizing the flexible wiring board 44 for electrically connecting the terminals 41b of the motor body 41 and the internal connection terminals (not shown) of the circuit board 50 to one another.

Moreover, since by the extremely simple configuration attained by providing the side of the frame 41a of the holder 43 with the spring 42, the frame 41a can be electrically connected to the flexible wiring board 44, cost is hardly increased, and it is made possible to inhibit the emission of the electromagnetic noise to the outside of the motor 40.

The frame 41a may forms an electromagnetic shield.

Second Embodiment

Next, a second embodiment according to the present disclosure will be described.

Since also in the second embodiment, a basic configuration is similar to the basic configuration of the first embodiment, hereinafter, points differing from the first embodiment will be mainly described, and the description as to the configuration similar to the configuration of the first embodiment may be omitted.

Figure 5:
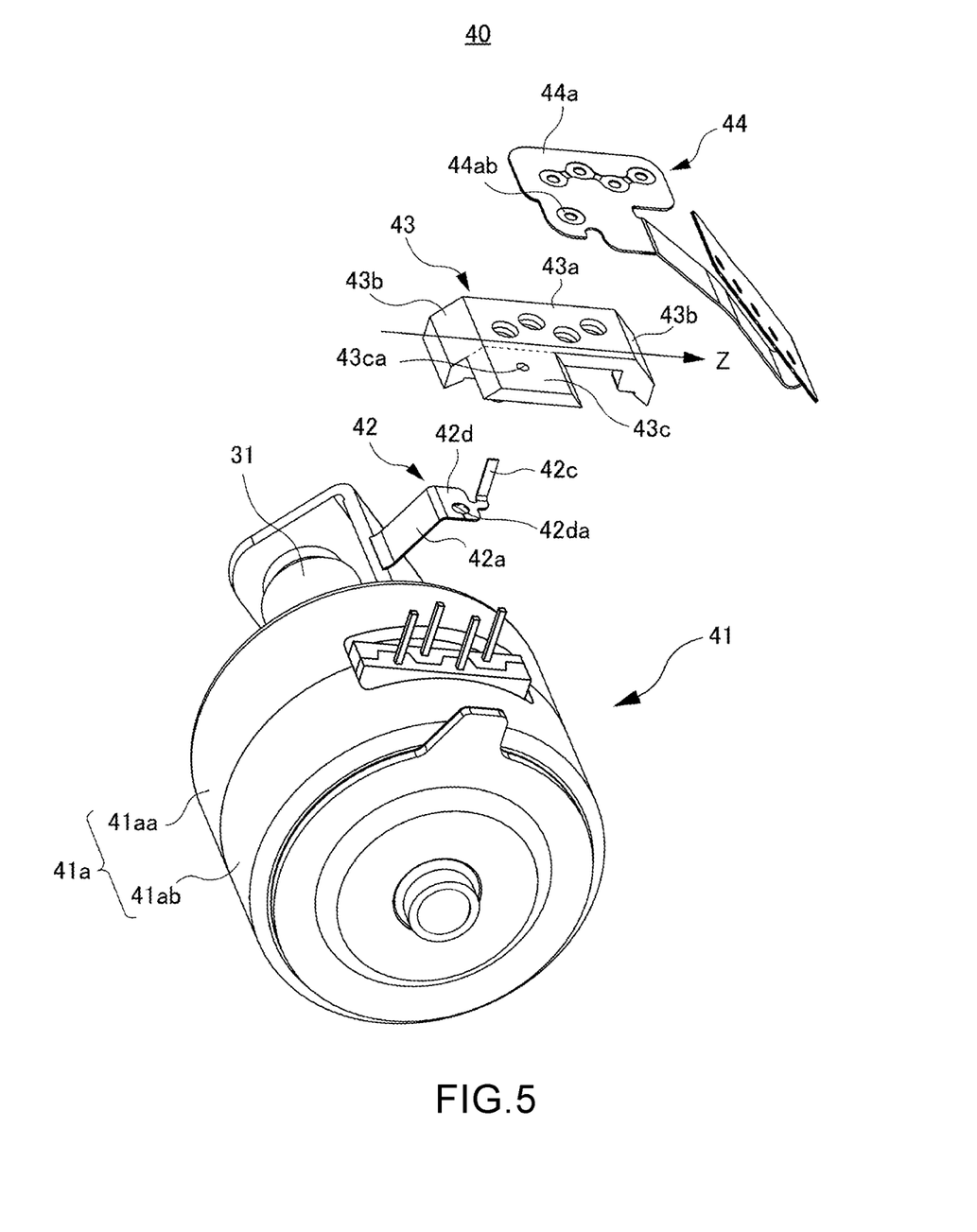
FIG. 5 is a partially exploded perspective view of a motor in a second embodiment according to the present disclosure.

FIG. 5 is a partially exploded perspective view of a motor 40 in the second embodiment.

In FIG. 5, a state with a worm gear 31 attached to a shaft of a motor 40 is shown.

In addition, a flexible wiring board 44 is also shown in FIG. 5.

Figure 6:
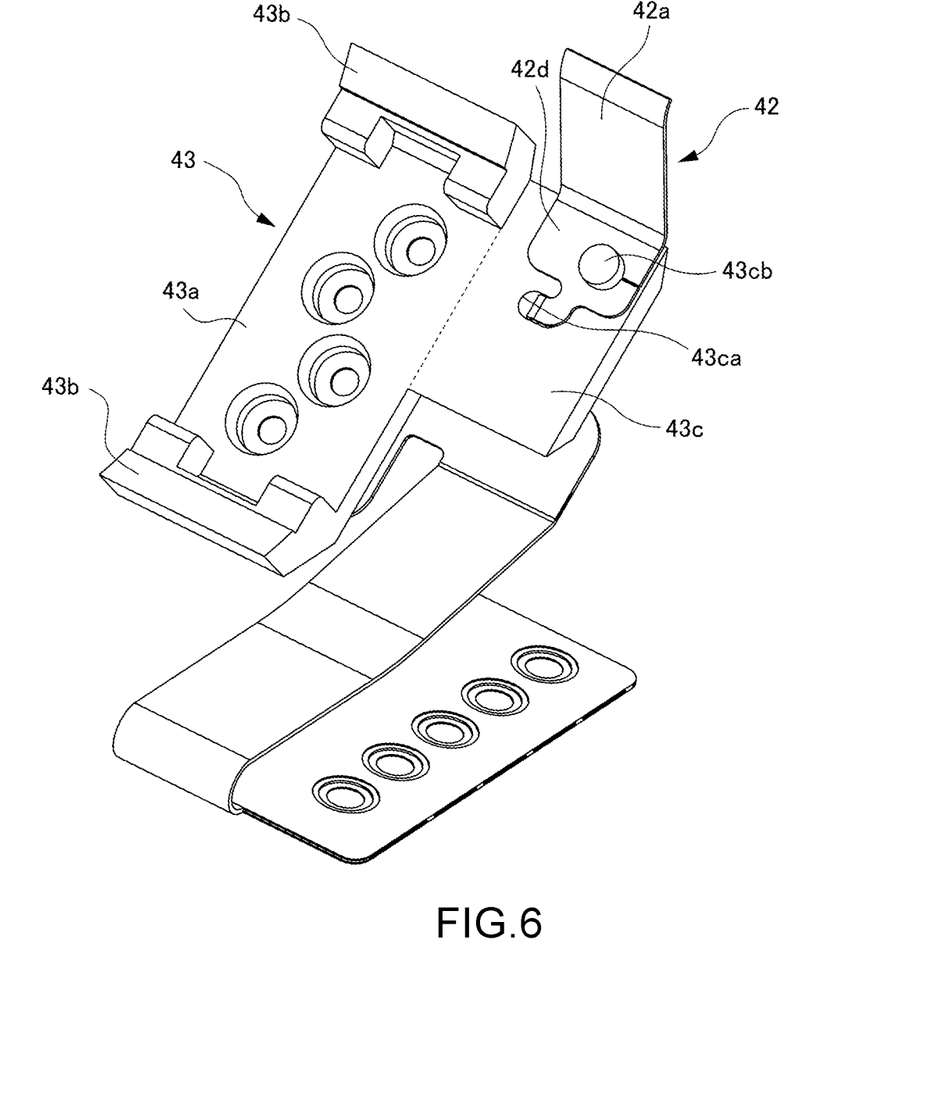
FIG. 6 is a perspective view showing a state with a spring, a holder, and a flexible wiring board assembled in the second embodiment according to the present disclosure.

In addition, FIG. 6 is a perspective view showing a state with a spring 42, a holder 43, and the flexible wiring board 44 in the second embodiment assembled.

FIG. 6 is the perspective view, viewed from a side of a frame 41a when the spring 42, the holder 43, and the flexible wiring board 44 are attached to the frame 41a.

As shown in FIG. 5, a motor body 41 and the flexible wiring board 44 are similar to those in the first embodiment, and in the second embodiment, the holder 43 and the spring 42 are different from those in the first embodiment.

The holder 43 in the second embodiment is provided with a fixing part 43c extending sideways from a placement part 43a (see FIG. 2) in the first embodiment and fixing the spring 42.

More specifically, supposing that a direction of alignment of a pair of supporting parts 43b is a first direction (see a Z axis), the holder 43 in the second embodiment is provided with the fixing part 43c formed in a direction (second direction) orthogonal to this first direction so as to extend from the placement part 43a.

A plane formed by this first direction and the second direction is along one surface of the placement part 43a.

The fixing part 43c is provided with a hole part 43ca for inserting a connection pin 42c of the spring 42.

In addition, as shown in FIG. 6, the fixing part 43c on the side of the frame 41a is provided with a circular protruding part 43cb projecting toward the side of the frame 41a and fixing the spring 42.

On the other hand, the spring 42 has a contact part 42d received by a surface of the fixing part 43c on the side of the frame 41a and one elastic part 42a bent from the contact part 42d toward the side of the frame 41a.

In addition, the spring 42 has the connection pin 42c provided at one part of the outer periphery of the contact part 42d and bent toward a side away from the frame 41a.

The contact part 42d is provided with a circular hole part 42da fitted to the protruding part 43cb of the fixing part 43c.

In order to facilitate fitting of the circular hole part 42da to the protruding part 43cb of the fixing part 43c, a slit is formed from the outer periphery of the contact part 42d toward the hole part 42da of the contact part 42d.

Even by configuring the holder 43 and the spring 42 as described above, as in the first embodiment, the connection pin 42c of the spring 42 is electrically connected to a land 44ab of the flexible wiring board 44 by using a conductive member such as solder, and the spring 42 connected to the land 44ab can be caused to contact the frame 41a.

Accordingly, as in the first embodiment, the frame 41a is electrically connected to a ground of a circuit board 50 via the flexible wiring board 44 and is made to serve as an electromagnetic shield.

Thus, also in the second embodiment, emission of electromagnetic noise generated inside the motor body 41 to the outside of the motor 40 can be inhibited.

Hereinbefore, the present disclosure is described based on the embodiments. However, the present disclosure is not limited to the embodiments, and it is needless to say that various modifications within the scope not departing from the gist of the present disclosure should be possible.

For example, the motor 40 may be used in an apparatus other than a rotary apparatus 10.

Also in this case, by electrically connecting the frame 41a to an external ground via the flexible wiring board 44, emission of electromagnetic noise to the outside of the motor 40 can be inhibited.

The spring in the above-described embodiment is a plate-like spring formed with a conductive member, and both end portions of the spring are elastic parts or bent parts formed by bending a plate member.

The spring is not limited to this and may be a plate-like spring having a wholly curved shape.

Specifically, the plate-like spring is curved convexly toward the holder from one end portion to another end portion of the spring.

Surfaces of the two end portions facing the frame contact the frame.

A central portion of the spring is supported by the holder, and a biasing force of the spring exerted from the frame toward the holder is inhibited by the holder.

Thus, the flexible wiring board is prevented from floating up in a direction from the frame toward the holder due to the spring. Connection failure of the flexible wiring board with terminals, caused by this floating-up of the flexible wiring board, can be prevented from occurring.

Accordingly, various modifications within the scope not departing from the gist of the present disclosure as described above are also embraced within the technical scope of the present disclosure, and this is apparent for those skilled in the art from the description of the appended claims.

Third Embodiment

Figure 8:
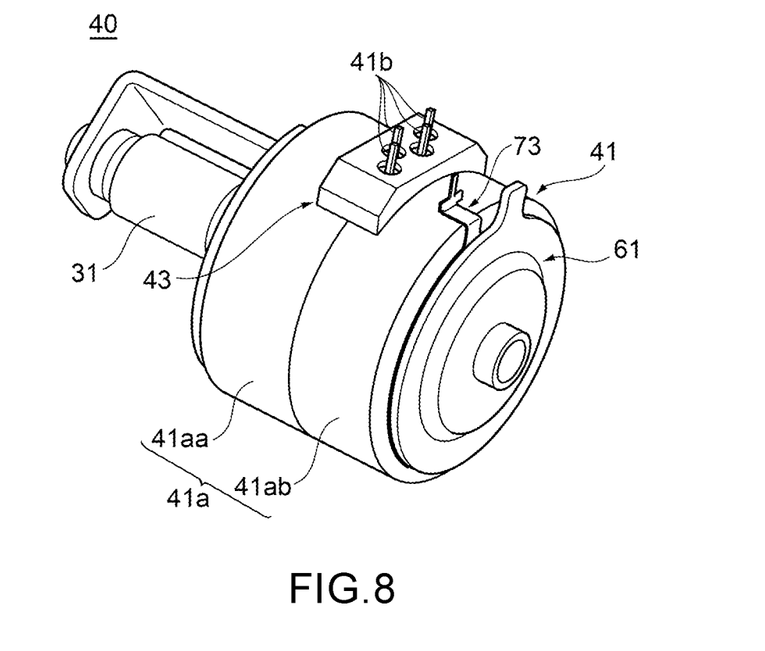
FIG. 8 is a perspective view showing a configuration of the motor with a flexible wiring board removed in the third embodiment according to the present disclosure.
Figure 9:
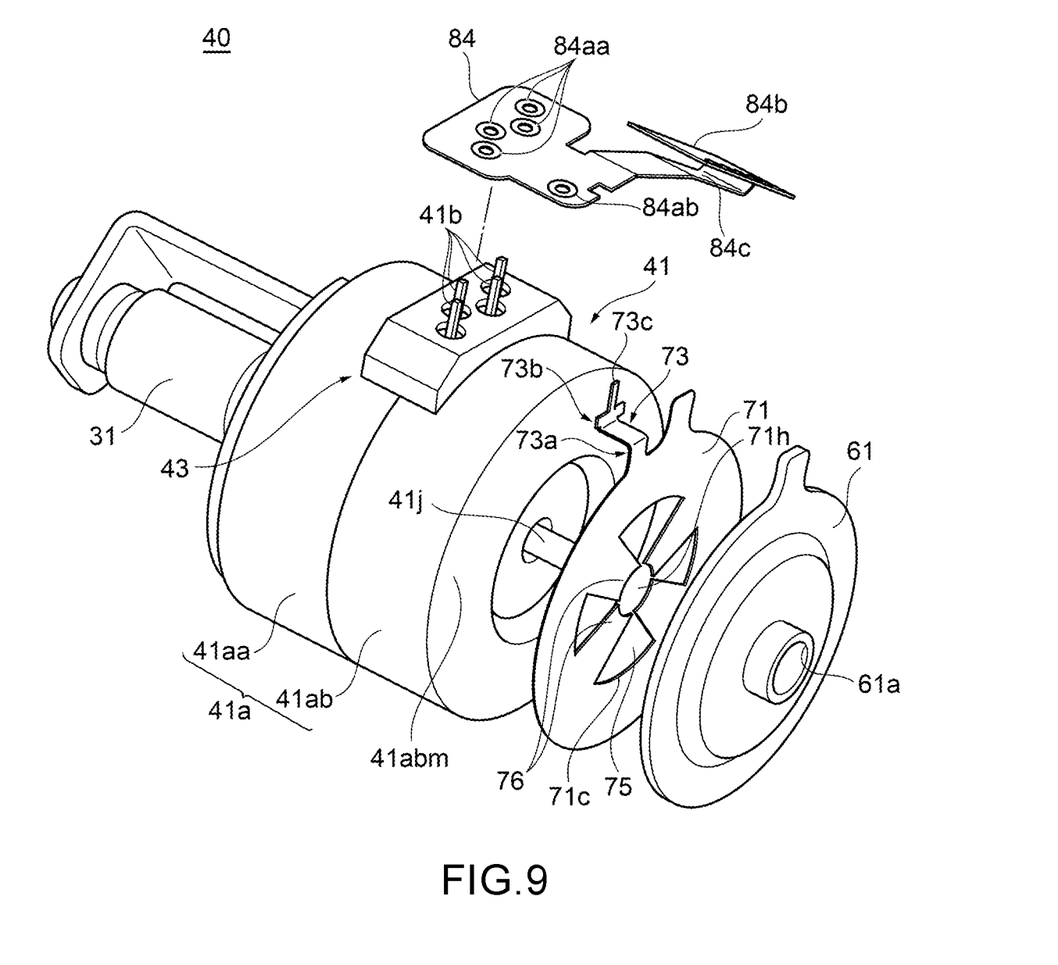
FIG. 9 is a partially exploded perspective view showing a configuration of the motor in the third embodiment according to the present disclosure.

Next, a third embodiment according to the present disclosure will be described with reference to FIG. 7 to FIG. 9. Since also in the third embodiment, a basic configuration is similar to the basic configuration of the first embodiment, hereinafter, points differing from the first embodiment will be mainly described, and the description as to the configuration similar to the configuration of the first embodiment may be omitted. As a side surface, an end surface and an outer peripheral side surface are included.

Figure 7:
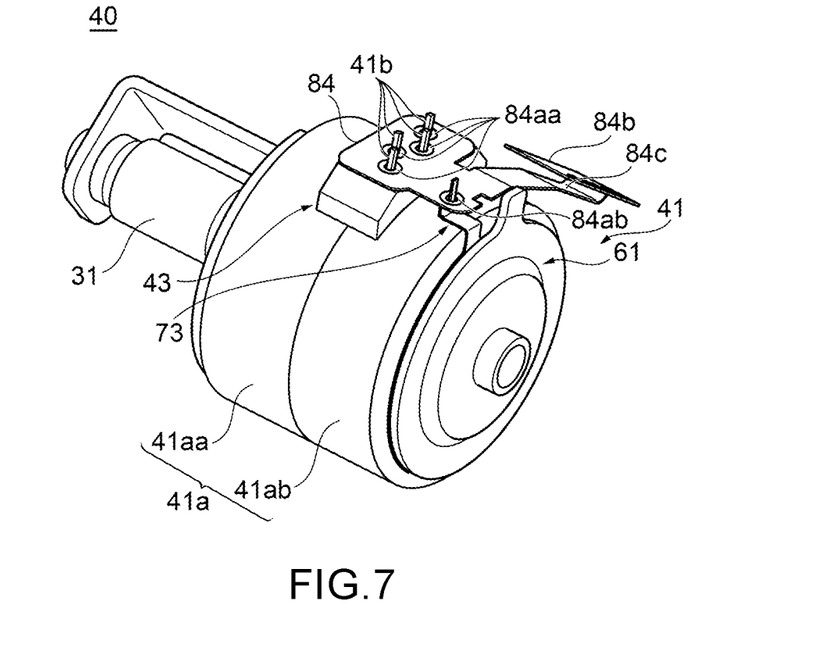
FIG. 7 is a perspective view showing a configuration of a motor in a third embodiment according to the present disclosure.
Figure 10:
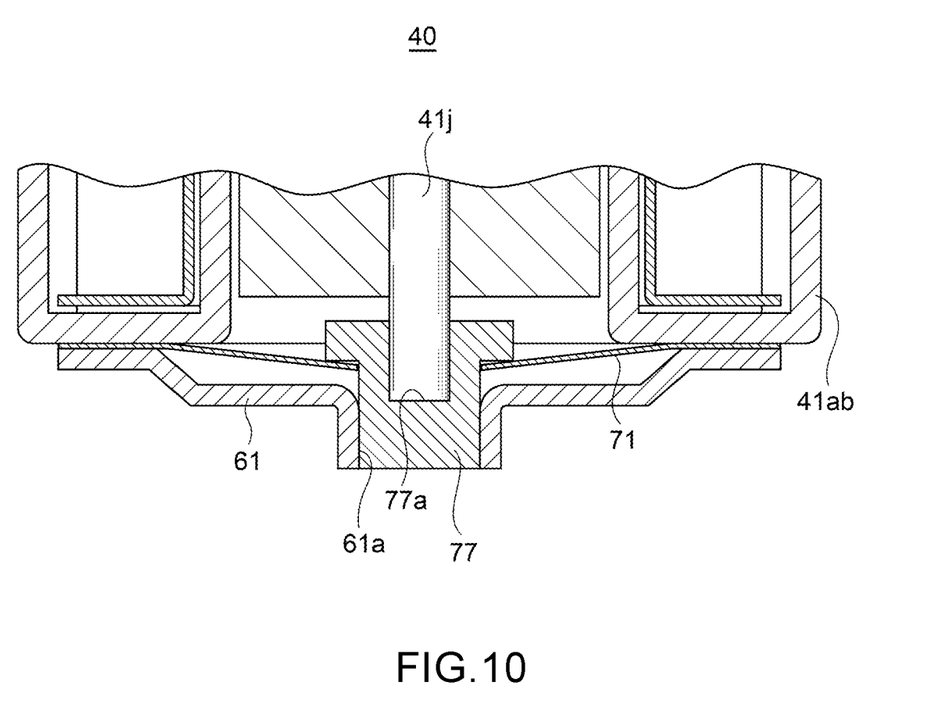
FIG. 10 is a sectional view showing one part of the motor in the third embodiment according to the present disclosure.

FIG. 7 is a perspective view showing a configuration of a motor 40 in the third embodiment. In FIG. 7, unlike in the first embodiment, a state with a flexible wiring board 84 and a frame 41a electrically connected via the later-described spring 71 is shown. To facilitate illustration, FIG. 8 shows a state with the flexible wiring board 84 removed. FIG. 9 is a partially exploded perspective view showing a configuration of the motor 40. FIG. 10 is a sectional view showing one part of the motor 40.

In the motor 40 in the third embodiment, instead of a flexible wiring board 44 in each of the first and second embodiments, the flexible wiring board 84 is used and instead of a spring 42, the spring 71 is used.

The flexible wiring board 84 has the same basic structure as the basic structure of the flexible wiring board 44 and has the same lands 84*aa* as the lands 44*aa* and the same land 84*ab* as the land 44*ab* of said flexible wiring board 44. However, an interval between the lands 84*aa* and the land 84*ab* is wider than an interval between the lands 44*aa* and the land 44*ab*. In addition, as similar to the flexible wiring board 44, the flexible wiring board 84 is provided with a second connection part 84*b*, lands 84*ba* (not shown), a land 84*bb* (not shown), and a wiring part 84*c* respectively corresponding to a second connection part 44*b*, lands 44*ba*, a land 44*bb*, and a wiring part 44*c*.

The spring 71 is supported to the frame 41*a*, with the spring 71 arranged between an end surface 41*abm* in an axis direction of a second frame 41*ab* of the frame 41*a* of a motor body 41 and a disk-shaped lid body 61 covering the end surface 41*abm* of the second frame 41*ab*.

Specifically, the spring 71 is a flat substantially disk-shaped thin plate-like member (hereinafter, also referred to as a "flat plate-like member") having an external diameter smaller than an external diameter of the second frame 41*ab* and same as or slightly smaller than a diameter of the lid body 61. However, the spring 71 is not limited to the disk-shaped spring, it is only required for the spring 71 to be the flat plate-like member, and the spring 71 may be of other shape such as a rectangular shape. The shapes of the first frame 41*aa* and the second frame 41*ab* are not limited to cylindrical shapes and may be square tube shapes or the like. Also in this case, an outer shape of the spring 71 is smaller than an outer shape of the second frame 41*ab*. The spring 71 has a portion formed to be ring-shaped, elastic parts projecting from the portion formed to be ring-shaped toward an inside of the spring 71 and having elasticity, and a through-hole 71*h* allowing a shaft 41*j* of the motor body 41 to be inserted into the central portion of the spring 71. The through-hole 71*h* has an external diameter larger than a diameter of the shaft 41*j*. The through-hole 71*h* and the later-described gaps 75 are surrounded by an inner peripheral part 71*c* of the spring 71 and formed as one part of an opening part of the spring 71.

In the spring 71, a plurality of the gaps 75 radially extending with the through-hole 71*h* being the center so as to each have a predetermined length are formed. The plurality of gaps 75 are formed in the spring 71 at regular intervals in a circumferential direction. Respectively between the plurality of gaps 75, elastic portions 76 are formed. The plurality of elastic portions 76 radially extend toward the through-hole 71*h* in a radial direction. The plurality of elastic portions 76 are capable of warping toward the lid body 61 in a direction of the shaft. In other words, the spring 71 has the plurality of elastic portions 76 warping in the direction of the shaft and being flexible respectively between the gap 75 and the gap 75.

The motor 40 in the third embodiment is further provided with a supporting member 77 rotatably supporting the shaft 41*j* to the lid body 61. This supporting member 77 is inserted or fitted into an opening part 61*a* provided in a central portion of the lid body 61. Inside the supporting member 77, a recessed part 77*a* is provided, and the shaft 41*j* is inserted into the recessed part 77*a*. An end portion of the shaft 41*j* is rotatably arranged inside the recessed part 77*a*. In addition, an outer peripheral portion of the supporting member 77 contacts the elastic portions 76 forming the through-hole 71*h* of the spring 71 and is supported by the elastic portions 76. An outer peripheral portion 71*b* of the spring 71 is arranged between an outer peripheral portion of the lid body 61 and the second frame 41*ab* and is fixed to the second frame 41*ab*. In addition, in the direction of the shaft, the elastic portions 76 of the spring 71 are warped from the end surface 41*abm* of the second frame 41*ab* toward the lid body 61, and end portions of the elastic portions 76 are located closer to a side of the lid body 61 than the outer peripheral portion of the spring 71. The warped elastic portions 76 of the spring 71 bias the shaft 41*j* toward an inside of the frame 41*a* via the supporting member 77.

The spring 71 has a projecting part 73 in the radial direction, extending from an outer peripheral edge of the spring 71 toward the outside (in such a direction as to be away from the frame 41*a*). This projecting part 73 has a bent shape having a first bent part 73*a* bent along the end surface 41*abm* and an outer peripheral side surface of the second frame 41*ab* and a second bent part 73*b* bent from the outer peripheral side surface of the frame 41*a* toward the flexible wiring board 84. The projecting part 73 has a connection pin 73*c* electrically connected to the flexible wiring board 84 and a coupling part (the first bent part 73*a* and the second bent part 73*b*) coupling the connection pin 73*c* and the outer peripheral edge of the spring 71. In the projecting part 73, the connection pin 73*c* may include the first bent part 73*a* and the second bent part 73b, the coupling part may include the first bent part 73a and the second bent part 73b, and the coupling part may include the first bent part 73a and the connection pin 73c may include the second bent part 73b.

Hereinafter, an example with the connection pin 73c including the second bent part 73b and with the second bent part 73b provided between the connection pin 73c and the first bent part 73a will be described.

Specifically, the spring 71 has the projecting part 73 projecting from the outer peripheral edge of said spring 71 to the outside. The projecting part 73 projects from the outer peripheral edge of the spring 71 in a direction perpendicular to the axis direction and is an L-shaped conductive member having the first bent part 73a bent along the end surface 41abm and the outer peripheral side surface of the second frame 41ab the second bent part 73b bent from the outer peripheral side surface of the frame 41a toward the flexible wiring board 84, and the connection pin 73c formed integrally with the second bent part 73b.

As with the connection pin 42c in the first and second embodiments, this projecting part 73 also plays a role as a terminal electrically connected to the flexible wiring board 84 by using the solder or the like. In other words, the projecting part 73 electrically connects the frame 41a and the flexible wiring board 84. In this case, the projecting part 73 of the spring 71 and the land 84ab of the flexible wiring board 84 are electrically connected.

The spring 71 having the configuration as described above is supported to the second frame 41ab being arranged and sandwiched between the end surface 41abm of the second frame 41ab and the lid body 61, with the shaft 41j of the motor body 41 inserted into the through-hole 71h together with the supporting member 77.

At this time, the plurality of elastic portions 76 of the spring 71 are biasing the supporting member 77. In other words, the shaft 41j is biased toward an inside of the second frame 41ab by an elastic force of the plurality of elastic portions 76 and thus, the movement of the shaft 41j in the direction of the shaft can be inhibited. As a result of this, even when the motor body 41 rotates the shaft 41j, the spring 71 is made possible to inhibit vibration of the motor and generation of sound.

Further, since the second frame 41ab is brought to be electrically connected to the land 84ab of the flexible wiring board 84 via the connection pin 73c of the spring 71, the frame 41a comes to have the same potential as a potential of a ground of a circuit board 50 and thus, is capable of playing a role as an electromagnetic shield. Hence, emission of electromagnetic noise generated inside the motor body 41 to the outside of the motor 40 can be inhibited.

In addition, the present disclosure is not limited to the above-described embodiments. Embodiments configured by appropriately combining the above-described components are also embraced in the present disclosure. In addition, further effects and variants can be easily derived by those skilled in the art. Hence, broader aspects of the present disclosure are not limited to the above-described embodiments, and various modifications should be possible.

What is claimed is:

1. A rotary apparatus comprising:
a housing;
a motor arranged inside the housing, the motor includes a frame formed with a conductive member;
a circuit board arranged inside the housing and electrically connected to the motor;
a flexible wiring board electrically connecting the motor to the circuit board; and
a flat plate-like member electrically attached to a side surface of the frame,
wherein the motor has a shaft,
the flat plate-like member has an elastic portion,
the elastic portion biases the shaft toward an inside of the frame,
the flat plat-like member is electrically connected to the flexible wiring board, and
the frame is electrically connected to a ground of the circuit board via the flat plate-like member and the flexible wiring board.

2. A rotary apparatus comprising:
a housing;
a lid body:
a motor arranged inside the housing;
a circuit board arranged inside the housing and electrically connected to the motor; and
a flexible wiring board electrically connecting the motor to the circuit board,
wherein the motor includes a frame formed with a conductive member, a plate-like spring contacts the frame,
the plate-like spring electrically connects the frame and the flexible wiring board,
the plate-like spring is arranged between the frame and the lid body, and
the plate-like spring biases a shaft toward an inside of the frame.

3. The rotary apparatus according to claim 2, wherein one part of the plate-like spring includes a bent shape.

4. The rotary apparatus according to claim 3, wherein the plate-like spring includes an outer peripheral edge and a projecting part, extending from the outer peripheral edge, and
the projecting part is said one part of the plate-like spring.

5. The rotary apparatus according to claim 4, wherein the projecting part is electrically connected to the flexible wiring board.

* * * * *